US008511798B2

(12) United States Patent
Ito

(10) Patent No.: US 8,511,798 B2

(45) Date of Patent: Aug. 20, 2013

(54) METHOD OF MANUFACTURING LIQUID DISCHARGE HEAD, LIQUID DISCHARGE HEAD AND INK-JET PRINTER

(75) Inventor: Seiko Ito, Konan (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 254 days.

(21) Appl. No.: 12/892,787

(22) Filed: Sep. 28, 2010

(65) Prior Publication Data

US 2011/0074891 A1 Mar. 31, 2011

(30) Foreign Application Priority Data

Sep. 29, 2009 (JP) ................................ 2009-225531

(51) Int. Cl.

*H01L 41/22* (2013.01)
*H04R 17/00* (2006.01)
*B41J 2/045* (2006.01)

(52) U.S. Cl.

USPC ........................................... 347/68; 29/25.35

(58) Field of Classification Search

None

See application file for complete search history.

(56) References Cited

U.S. PATENT DOCUMENTS

| | | | | |
|---|---|---|---|---|
| 7,598,826 | B2 * | 10/2009 | Yamaguchi et al. | 333/187 |
| 2006/0061633 | A1 | 3/2006 | Nakayama | |
| 2007/0076061 | A1 | 4/2007 | Watanabe et al. | |
| 2009/0002462 | A1 * | 1/2009 | Okawa et al. | 347/72 |

FOREIGN PATENT DOCUMENTS

| | | | |
|---|---|---|---|
| JP | 2004-304025 | A | 10/2004 |
| JP | 2006-082480 | A | 3/2006 |
| JP | 2007-097280 | A | 4/2007 |
| JP | 2008-230052 | A | 10/2008 |
| JP | 2009-078564 | A | 4/2009 |

* cited by examiner

*Primary Examiner* — Matthew Luu

*Assistant Examiner* — Erica Lin

(74) *Attorney, Agent, or Firm* — Baker Botts L.L.P.

(57) ABSTRACT

A liquid discharge head may include a flow channel unit having a plurality of pressure chambers. The head may be manufactured by manufacturing an actuator unit having a piezoelectric layer which covers the pressure chambers. The actuator unit may be manufactured by forming a first electrode and a second electrode thicker than the first electrode on the actuator unit, and forming a conductive layer laminated on the first electrode. The conductive layer may deform, and the sum of the thicknesses of the conductive layer and the first electrode may be larger than the thickness of the second electrode prior to the fixing step. The head may be manufactured by positioning the actuator unit on a cavity plate, and fixing the actuator unit to the cavity plate by heating and pressurizing. The conductive layer may be deformed by the pressurizing force more than the first and the second electrode.

11 Claims, 11 Drawing Sheets

METHOD OF MANUFACTURING LIQUID DISCHARGE HEAD, LIQUID DISCHARGE HEAD AND INK-JET PRINTER

CROSS REFERENCE TO RELATED APPLICATION

This application claims priority to Japanese Patent Application No. 2009-225531, filed Sep. 29, 2009, the entire subject matter and disclosure of which is incorporated herein by reference.

BACKGROUND OF THE DISCLOSURE

1. Field of the Disclosure

The features herein relate to a method of manufacturing a liquid discharge head which is configured to discharge liquid, a liquid discharge head which is configured to discharge liquid and an ink-jet printer including the liquid discharge head.

2. Description of the Related Art

A known ink-jet head includes a flow channel unit provided with a plurality of pressure chambers formed on an upper surface thereof, and actuator units fixed with heat cured adhesive agent on the upper surface of the flow channel unit so as to cover the openings of the pressure chambers. The actuator units includes a plurality of laminated piezoelectric layers, a plurality of individual electrodes arranged on the outermost piezoelectric layer so as to oppose the pressure chambers, and a common electrode arranged between the outermost piezoelectric layer and the next piezoelectric layer. The individual electrodes and the common electrode are electrically connected to a flexible printed circuit (FPC) including a driver IC mounted thereon. Driving signals assuming a ground potential and a positive potential alternately according to an image pattern to be printed are supplied from the driver IC to the individual electrodes. Signals maintained at the ground potential are supplied to the common electrode. Accordingly, portions of the piezoelectric member opposing the pressure chambers are displaced, and a pressure is applied to ink in the pressure chambers, and the ink is discharged from nozzles to form a desired image.

In the above-described ink-jet head, individual lands are projected from the individual electrodes respectively. The individual electrodes and the FPC are electrically connected via the individual lands. A surface electrode connected to the common electrode is provided on the outermost piezoelectric layer in the same manner as the individual electrodes. The common electrode and the FPC are electrically connected via a common bump on the surface electrode. The surface electrode and the common bump are arranged in the vicinity of an end portion of the upper surface of the piezoelectric layer to avoid the plurality of individual electrodes. When manufacturing the ink-jet head, heat cured adhesive agent is applied on the upper surface of the prefabricated flow channel unit. Then, the actuator units are placed on the heat cured adhesive agent, and heated while being pressurized against the flow channel unit using a flat-panel-shaped jig. In this manner, the heat cured adhesive agent between these members is cured, such that the flow channel unit and the actuator units are fixed.

However, the surface electrode and the individual electrodes may be varied in thickness, because they are configured by baking conductive paste screen printed into a predetermined pattern. The thickness of the heat cured adhesive agent may be varied. When the thickness of the heat cured adhesive agent varies, the pressure to be applied to the ink in the pressure chambers may vary, and the quality of printed images may be lowered.

SUMMARY OF THE DISCLOSURE

According to an embodiment of the invention, a method of manufacturing a liquid discharge head comprising a flow channel unit comprising a plurality of pressure chambers which are opened on one surface thereof, may comprise the step of manufacturing an actuator unit comprising a piezoelectric layer which covers the pressure chambers, and is adhered to the one surface of the flow channel unit such that the piezoelectric layer provides a pressure to liquid in the pressure chambers. The step of manufacturing the actuator unit may comprise the step of forming a first electrode and a second electrode on the actuator unit to be positioned on a surface of the piezoelectric layer, wherein the second electrode is thicker than the first electrode. The step of manufacturing the actuator unit may comprise the step of forming a conductive layer which is laminated on the first electrode, wherein the conductive layer comprises a material subject to deformation by a pressurizing force, such that the sum of the thicknesses of the conductive layer and the first electrode is larger than the thickness of the second electrode prior to the fixing step. The method of manufacturing a liquid discharge head may comprise the step of positioning the actuator unit on a cavity plate comprising the one surface of the flow channel unit via a heat cured adhesive agent. The method of manufacturing a liquid discharge head may comprise the step of fixing the actuator unit to the cavity plate, wherein the fixing step comprises heating and pressurizing by a jig, and wherein the conductive layer is deformed by the pressurizing force more than the first and the second electrode.

According to another embodiment, a liquid discharge head may comprise a flow channel unit comprising a plurality of pressure chambers which are opened on one surface thereof, and an actuator unit. The actuator unit may comprise a piezoelectric layer which extends across the plurality of pressure chambers. The actuator unit may comprise a plurality of first electrodes which are positioned on a surface of the piezoelectric layer on the opposite side from the flow channel unit and oppose the pressure chambers. The actuator unit may comprise a common electrode which has a size extending across the plurality of pressure chambers and interposes the piezoelectric layer in cooperation with the plurality of first electrodes therebetween. The piezoelectric layer may comprise a second electrode which is positioned on the surface of the piezoelectric layer and electrically connected to the common electrode, the second electrode being thicker than each of the plurality of first electrodes. The liquid discharge head may comprise a plurality of conductive layers which are positioned on the first electrodes and are configured to deform more than the first and second electrodes when an external force is applied.

According to yet another embodiment, an ink-jet printer may comprise a liquid discharge head. The liquid discharge head may comprise a flow channel unit comprising a plurality of pressure chambers which are opened on one surface thereof, and an actuator unit. The actuator unit may comprise a piezoelectric layer which extends across the plurality of pressure chambers. The actuator unit may comprise a plurality of first electrodes which are positioned on a surface of the piezoelectric layer on the opposite side from the flow channel unit and oppose the pressure chambers. The actuator unit may comprise a common electrode which has a size extending across the plurality of pressure chambers and interposes the piezoelectric layer in cooperation with the plurality of first electrodes therebetween. The actuator unit may comprise a second electrode which is positioned on the surface of the piezoelectric layer and electrically connected to the common electrode, the second electrode being thicker than each of the plurality of first electrodes. The liquid discharge head may comprise a plurality of conductive layers which are positioned on the first electrodes and are configured to deform more than the first and second electrodes when an external force is applied. The ink-jet printer may comprise a transporting unit which is configured to transport a paper under the liquid discharge head so as to oppose thereto. The ink-jet printer may comprise a paper feed unit which is configured to feed the paper stored therein to the transporting unit. The ink-jet printer may comprise a controller which is configured to control the operations of the liquid discharge head, the transporting unit and the paper feed unit.

Other objects, features, and advantages of embodiments of the present invention will be apparent to persons of ordinary skill in the art from the following description of embodiments with reference to the accompanying drawings.

BRIEF DESCRIPTION OF THE DRAWINGS

Embodiments of a method of manufacturing a liquid discharge head and a liquid discharge head are described with reference to the accompanying drawings, which are given by way of example only, and are not intended to limit the present application.

DETAILED DESCRIPTION OF EMBODIMENTS

Various embodiments, and their features and advantages, may be understood by referring to FIGS. 1-11, like numerals being used for corresponding parts in the various drawings.

Figure 11:
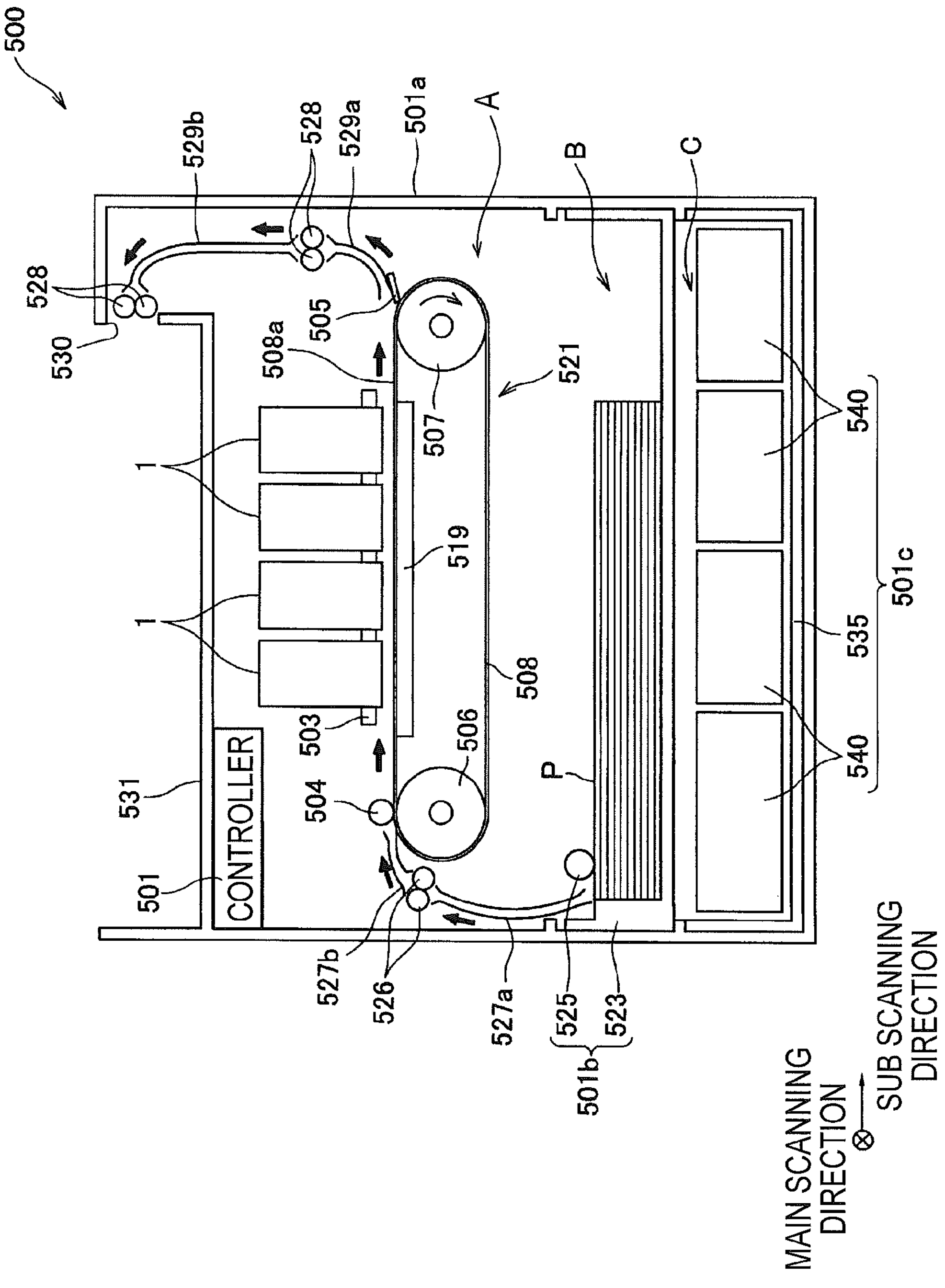
FIG. 11 is a schematic side view showing an internal structure of an ink-jet printer in which an ink-jet head according to an embodiment is employed.

Referring to FIG. 11, an ink-jet printer 500 may include a plurality of ink-jet heads 1 according to an embodiment. Each ink-jet head 1 may be an elongated line head along a direction which is vertical to the plane of the paper in FIG. 11. The plurality of ink-jet heads 1 may be arranged such that the elongated direction thereof corresponds to the main scanning direction in the printer 500. The printer 500 may be a color ink-jet printer.

The printer 500 may include a housing 501*a* having a substantially rectangular parallelepiped shape. The housing 501*a* may be provided with a paper discharge portion 531 on an upper portion of a top panel. The internal space of the housing 501*a* may be divided into three spaces A, B, and C in sequence from the top. In the space A, a plurality of, e.g., four, ink-jet heads 1 may be arranged in parallel at predetermined intervals along the sub scanning direction. The plurality of, e.g., four, ink-jet heads 4 may be supported by the housing 501*a* via a frame 503. The plurality of, e.g., four, ink-jet heads 1 may discharge ink in magenta, cyan, yellow, and black, respectively. A transporting unit 521, which is configured to transport a paper P under the respective ink-jet heads 1 so as to oppose thereto, may be positioned in the space A. Also, a controller 501, which is configured to control the operations of the respective components of the printer 500, may be positioned in the space A.

A paper feed unit 501*b* may be positioned in the space B so as to be detachable to the housing 501*a* in the main scanning direction. Also, an ink unit 501*c* may be positioned in the space C so as to be detachable to the housing 501*a* in the primary direction. A paper transporting route, which is configured to transport the paper P along a thick arrow shown in FIG. 11, may be formed in the interior of the printer 500. Here, the sub scanning direction may be a direction parallel to the transporting direction when transporting the paper P by the transporting unit 521, and the main scanning direction may be a direction orthogonal to the sub scanning direction along a horizontal plane.

The paper feed unit 501*b* may include a paper feed tray 523 for storing a plurality of papers P, and a paper feed roller 525. The paper feed roller 525 may be mounted to the paper feed tray 523. The paper feed roller 525 may rotate by a paper feed motor (not shown), and may feed the uppermost paper P on the paper feed tray 523. The fed paper P may be guided by guides 527*a* and 527*b*, and may be fed to the transporting unit 521 while being pinched by feed roller pair 526.

The transporting unit 521 may include a plurality of, e.g., two, belt rollers 506 and 507, and an endless transporting belt 508 which is wound between the rollers 506 and 507 so as to run therebetween. The belt roller 507 may be a driving roller, and may rotate clockwise, when positioned as shown in the FIG. 11, by a driving motor (not shown) under the control of the controller 501. The belt roller 506 may be a driven roller, and may rotate clockwise, when positioned as shown in the FIG. 11, in the same manner in association with the travel of the transporting belt 508.

In the loop of the transporting belt 508, a platen 519 having a substantially rectangular parallelepiped shape opposing the plurality of, e.g., four, ink-jet heads 1 may be arranged. An upper part of the loop of the transporting belt 508 may be supported by the platen 519 from the side of the inner peripheral surface. An outer peripheral surface 508*a* of the transporting belt 508 is positioned at a distance suitable for image formation on the paper P placed thereon, from ink discharging areas of the plurality of, e.g., four, ink-jet heads 1.

The outer peripheral surface 508*a* of the transporting belt 508 may be configured with a silicon layer having weak adhesion characteristics. The paper P fed from the paper feed unit 501*b* may be pressed against the outer peripheral surface 508*a* of the transporting belt 508 by a holding roller 504, and then may be transported in the sub scanning direction along thick arrows while being held on the outer peripheral surface 508*a* by an adhesive force from the silicon layer.

When the paper P passes immediately below the plurality of, e.g., four, ink-jet heads 1, ink drops of respective colors may be discharged in sequence from the ink discharging areas of the respective heads 1 toward the upper surface of the paper P under the control of the controller 501, such that a desired color image is formed on the paper P. The paper P may be further transported and may be separated from the outer peripheral surface 508*a* by a separation plate 505. Subsequently, the paper P may be transported upward by guides 529*a* and 529*b* and a plurality of e.g., two, feed roller pairs 528, and may be discharged from an opening 530 on the upper portion of the housing 501*a* onto the paper discharge portion 531. One feed roller of the feed roller pair 528 may rotate by a feeding motor (not shown) under the control of the controller 501.

The ink unit 501*c* may include a cartridge tray 535 and ink cartridges 540 corresponding to the respective one of the plurality of, e.g., four, heads 1. The ink unit 501*c* may be configured to be removable with respect to the space C in a state in which the plurality of, e.g., four, ink cartridges 540 are arranged in parallel to each other and aligned in the sub scanning direction on the cartridge tray 535.

Figure 1:
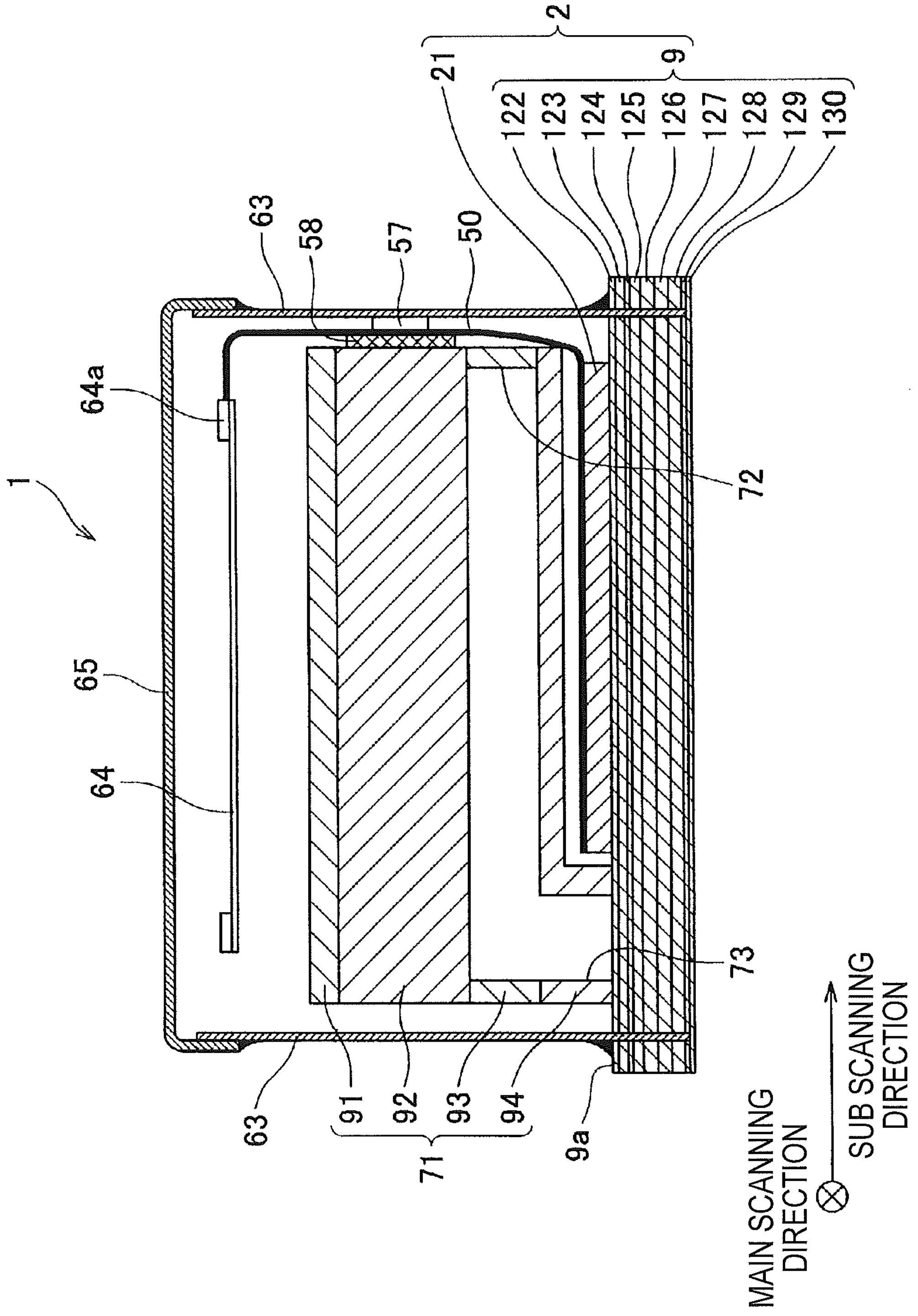
FIG. 1 is a vertical cross-sectional view of an ink-jet head according to an embodiment.

Referring to FIG. 1, the ink-jet head 1 may include a head body 2 which is configured to discharge ink, a reservoir unit 71 which is configured to supply ink to the head body 2, and a plurality of, e.g., four, COFs "Chip On Film" 50 electrically connected to the head body 2.

Figure 2:
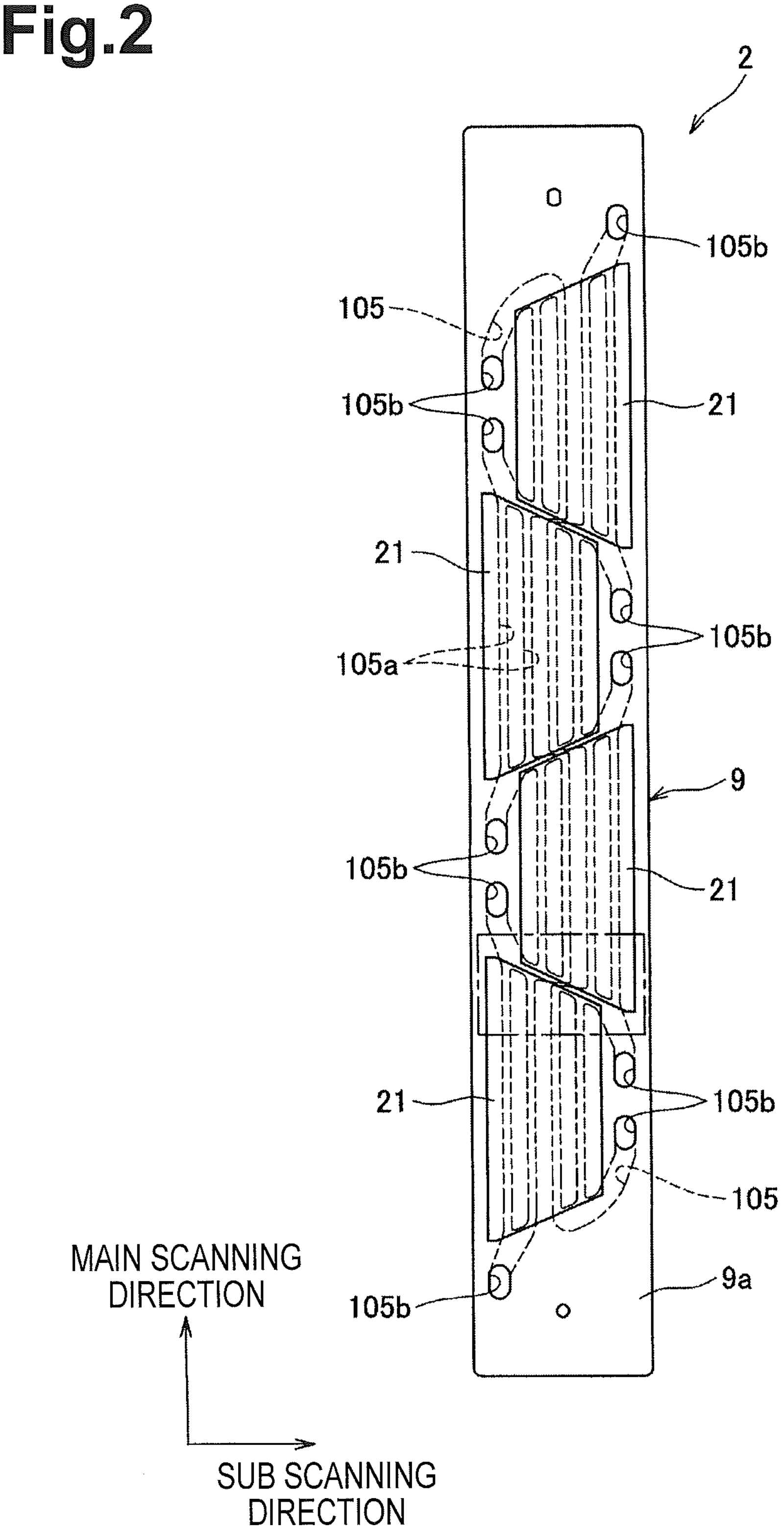
FIG. 2 is a plan view of a head body of the ink-jet head shown in FIG. 1.

The head body 2 may include a flow channel unit 9 having a rectangular parallelepiped shape elongated along the main scanning direction (the direction orthogonal to the plane of the paper in FIG. 1), and a plurality of, e.g., four, actuator units 21 each formed into a trapezoidal shape in plan view, e.g., as shown in FIG. 2, adhered to the flow channel unit 9.

Figure 3:
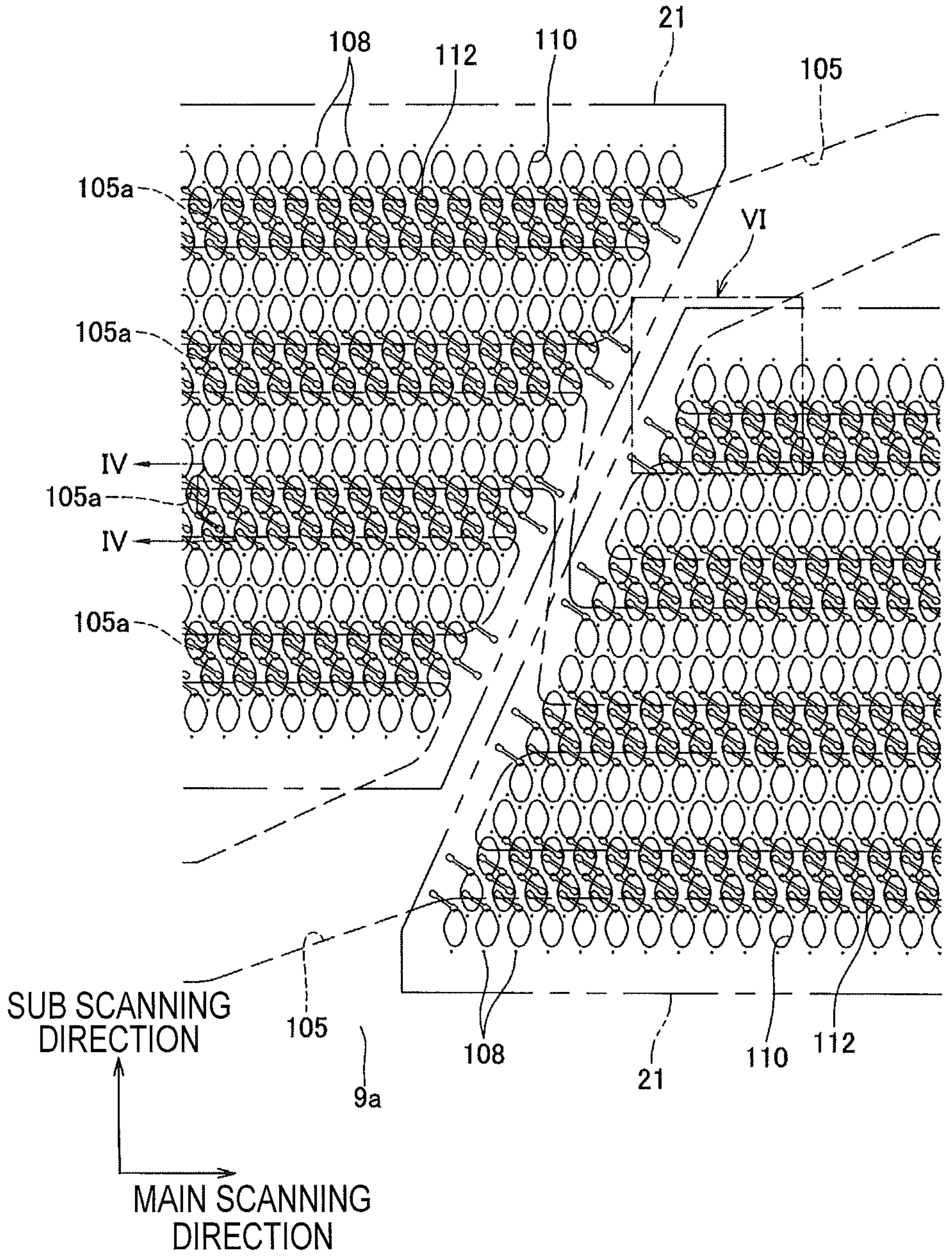
FIG. 3 is an enlarged view of an area surrounded by a long and short dash line shown in FIG. 2.

Referring to FIG. 3, a plurality of pressure chambers 110 may be opened in a matrix pattern in an area of an upper surface 9*a* of the flow channel unit 9 where the respective actuator units 21 are positioned. Ink discharging areas, in which a plurality of nozzles 108 are formed in a matrix pattern, may be positioned in areas of a lower surface of the flow channel unit 9 opposing the actuator units 21. The respective actuator units 21 may be positioned so as to close the openings of the respective pressure chambers 110 in the area where they are positioned. The actuator units 21 may include actuators corresponding to the respective pressure chambers 110. The actuator units 21 may selectively provide the ink in the pressure chambers 110 with discharging energy.

Figure 7:
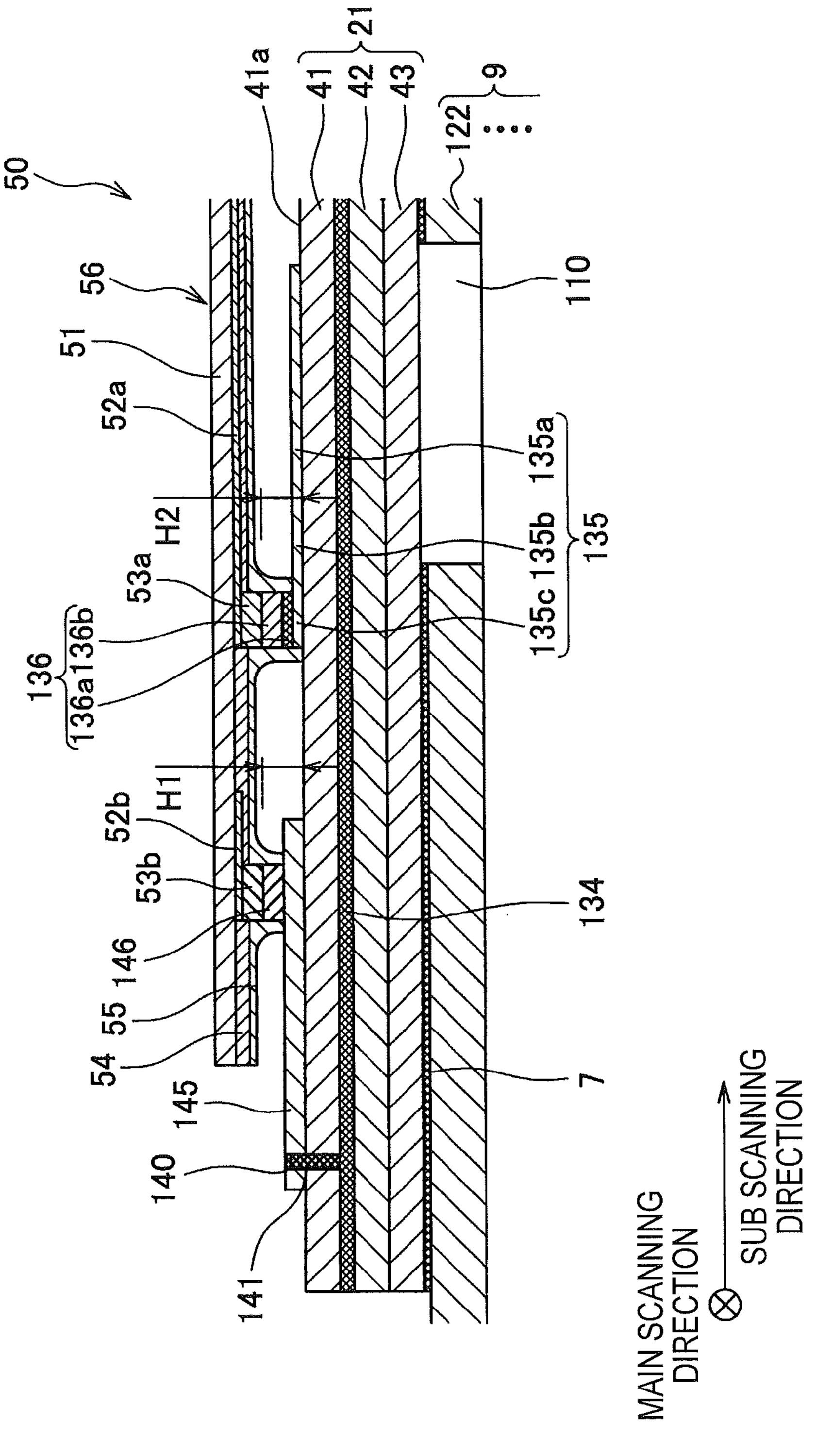
FIG. 7 is a cross-sectional view taken along the line VII-VII shown in FIG. 6.

Referring back to FIG. 1, a portion in the vicinity of one end of the COF 50 may be fixed to the upper surface of the each actuator unit 21. The COF 50 may be a flat-type flexible substrate on which a driver IC 57 is mounted. Respective terminals 53*a* and 53*b* of the COF50 may be electrically connected to an individual electrode 135 and a surface electrode 145, e.g., as shown in FIG. 7, of the actuator unit 21. The COF 50 may extend from the lower bottom side of the actuator unit 21, and then may extend upward therefrom. The other end of the COF 50 may be connected to a control substrate 64 arranged above the reservoir unit 71 via a connector 64*a*. The control substrate 64 may control the drive of the actuator unit 21 via the driver IC 57. More specifically, the driver IC 57 may generate a driving signal which assumes a positive or negative predetermined potential alternately with respect to a ground potential according to the image data, and may supply the same to individual electrodes 135. Also, the driver IC 57 may generate a signal maintained at the ground potential, and may supply the same to a common electrode 134, e.g., as shown in see FIG. 7.

The actuator unit 21, the reservoir unit 71, the COF 50, and the control substrate 64 may be covered with a side cover 63 and a head cover 65. The side cover 63 includes a metal plate that may extend along the longitudinal direction of the flow channel unit 9. The side cover 63 may be fixed to portions in the vicinity of both ends of the flow channel unit 9 in the sub scanning direction. The head cover 65 may be fixed astride two upper ends of the side cover 63. The side cover 63 may include the driver IC 57 in close contact thereto, such that the side cover 63 functions as a heat sink. The driver IC 57 may be pressed against the side cover 63 with a sponge 58 adhered to a side surface of the reservoir unit 71.

The reservoir unit 71 may include a plurality of, e.g., four, plates 91 to 94 stacked one on top of another. An ink inflow channel (not shown), an ink reservoir 72, and a plurality of, e.g., ten, ink outflow channels 73 may be formed so as to communicate with each other in the interior of the reservoir unit 71. In FIG. 1, only one of the ink outflow channels 73 is shown. The ink from the ink cartridge 540 may pass through the ink inflow channel, the ink reservoir 72, and the ink outflow channels 73, and may be supplied from ink supply ports 105*b*, e.g., as shown in FIG. 2, to the flow channel unit 9. A lower surface of the plate 94 may be formed with protrusions and depressions so as to form a gap between the plate 94 and the COF 50. The ink outflow channels 73 may be formed in the protrusions of the plate 94.

Referring to FIG. 2, the flow channel unit 9 may have a rectangular parallelepiped shape, which is substantially the same as the plate 94 of the reservoir unit 71, in plan view. The upper surface 9*a* of the flow channel unit 9 may be provided with the plurality of, e.g., ten, ink supply ports 105*b* corresponding to the ink outflow channels 73, e.g., as shown in FIG. 1, of the reservoir unit 71. Manifold flow channels 105 may be in fluid communication with the ink supply ports 105*b*, and sub manifold flow channels 105*a* branched from the manifold flow channels 105 may be formed in the interior of the flow channel unit 9.

The each pressure chamber 110 on the upper surface 9*a* may have a diamond shape with rounded corners in plan view. One end of the pressure chamber 110, i.e., one of acute angle portions, may be in fluid communication with the nozzle 108. The other end, i.e., the other acute angle portion, of the pressure chamber 110 may be in fluid communication with the sub manifold flow channel 105*a* via the aperture 112.

Figure 4:
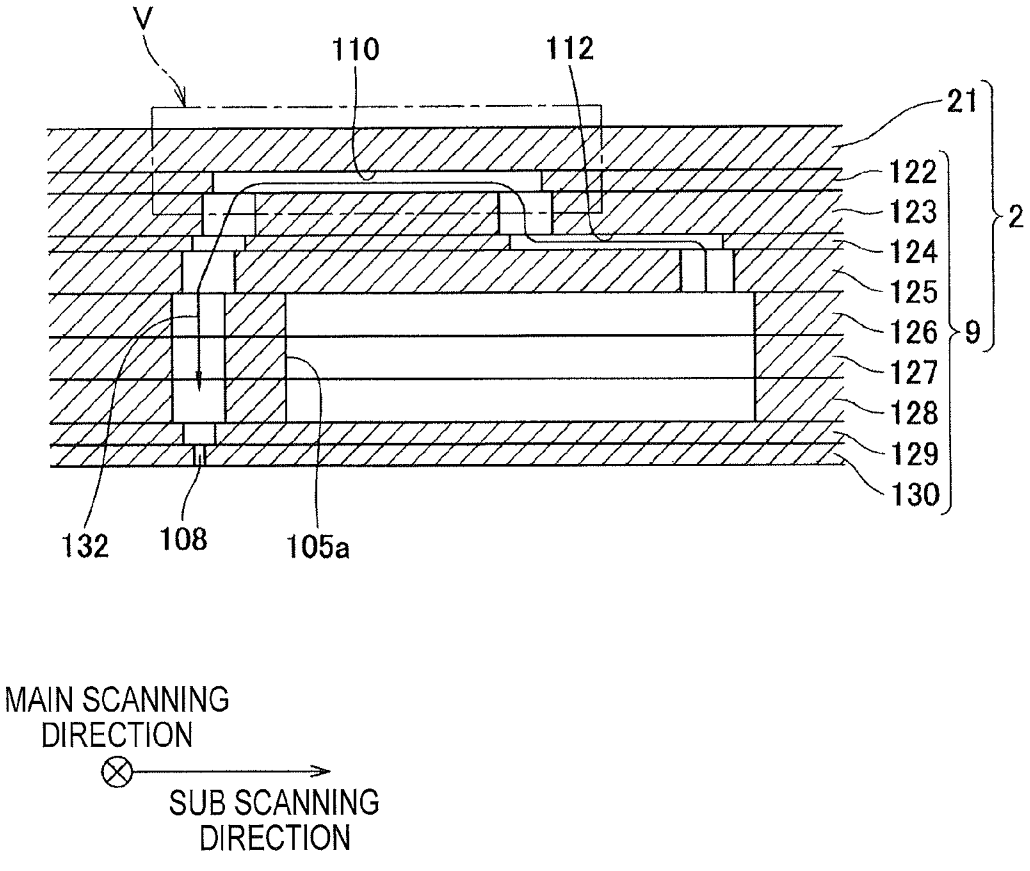
FIG. 4 is a cross-sectional view taken along the line IV-IV shown in FIG. 3.

Referring to FIG. 4, the flow channel unit 9 may be configured as a laminated structure including a plurality of, e.g., nine, metal plates 122 to 130 of stainless steel or the like including a cavity plate 122 as the uppermost layer. The metal plates 122 to 130 each may have a rectangular shape elongated in the main scanning direction in plan view. The metal plates 122 to 130 may be positioned and stacked such that individual ink flow channels 132 are formed in the flow channel unit 9 corresponding to the respective pressure chambers 110. The cavity plate 122 may be formed with a plurality of holes, which function as the pressure chambers 110. Upper openings of the holes may be covered with the actuator unit 21, and lower openings of the holes may be partially covered with the metal plate 123. In addition to the manifold flow channels 105 and the sub manifold flow channels 105*a*, the individual ink flow channels 132 each extending from an exit of the sub manifold flow channel 105*a* through the aperture 112 and the pressure chamber 110 to the nozzle 108 may be formed in the interior of the flow channel unit 9.

Referring back to FIG. 2, the plurality of, e.g., four, actuator units 21 may be arranged in a zigzag pattern in the main scanning direction so as to avoid the ink supply ports 105*b*. The parallel opposed sides of the actuator unit 21 may extend in the main scanning direction. The inclined sides of the adjacent actuator units 21 may overlap with each other along a line extending in the sub scanning direction.

Figure 5A:
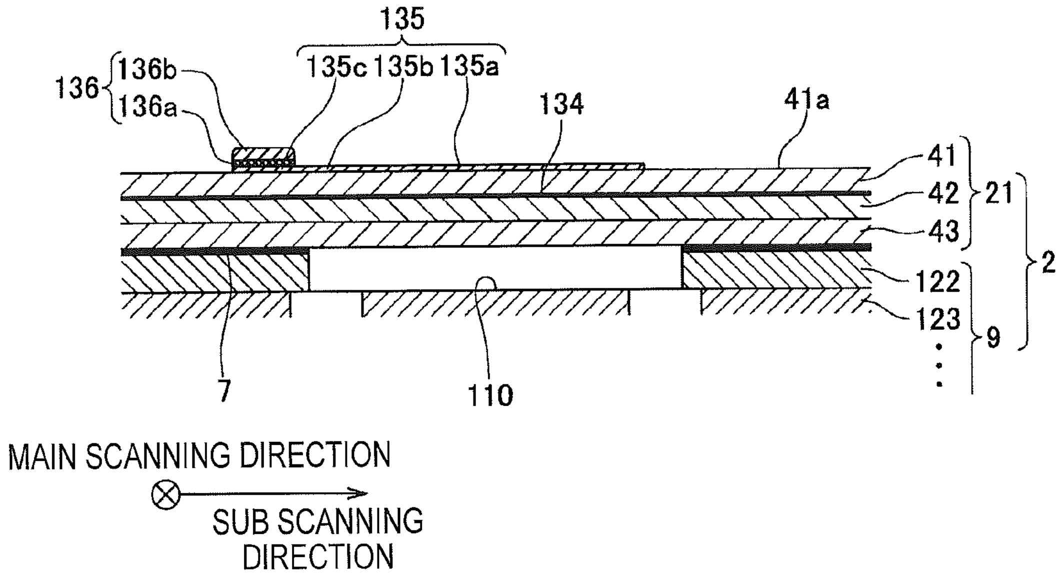
FIG. 5A is an enlarged view of an area surrounded by a long and short dash line shown in FIG. 4.

Referring to FIG. 5A, the actuator unit 21 may include a plurality of, e.g., three, piezoelectric ceramic layers 41 to 43, the plurality of individual electrodes 135 arranged on an upper surface 41*a* of the uppermost piezoelectric ceramic layer 41, a surface electrode 145, and the common electrode 134 positioned between the two piezoelectric ceramic layers 41 and 42 over the entire surfaces thereof. The respective individual electrodes 135 may be arranged in a matrix pattern so as to oppose the pressure chamber 110. The surface electrode 145 may be connected to the common electrode 134. The piezoelectric ceramic layers 41 to 43 may be configured of a ceramic material having feroelectricity, e.g., lead zirconate titanate (PZT). The piezoelectric ceramic layers 41 to 43 each may have a thickness on the order of 15 μm, and may have a trapezoidal shape which defines the outline of the actuator units 21.

Figure 5B:
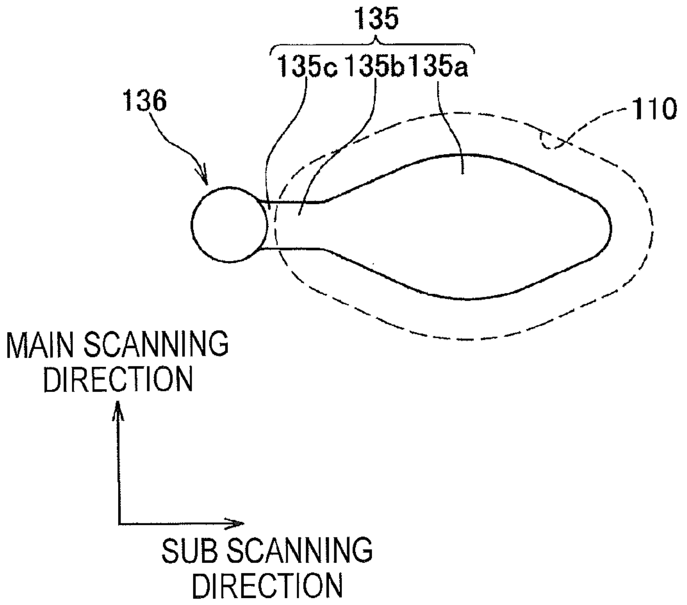
FIG. 5B is a plan view showing an individual electrode according to an embodiment of the invention.

Referring to FIG. 5B, the individual electrodes 135 may include a main electrode 135*a* being substantially similar to the pressure chamber 110 and having a substantially diamond shape slightly smaller than the pressure chamber 110, an extending portion 135*b* extending from one of the acute angle portions of the main electrode 135*a* in the longitudinal direction, i.e., sub scanning direction of the main electrode 135*a*, and a distal end portion, i.e., outside electrode portion 135*c* of the extending portion 135*b* opposing the outside area of the pressure chamber 110.

The individual land 136 may include a conductive layer 136*a* laminated on the surface of the outside electrode portion 135*c*, and an individual bump 136*b* laminated on an upper surface of the conductive layer 136*a*, e.g., as shown in FIG. 5A. The conductive layer 136*a* may be configured of conductive heat cured adhesive agent including silver mixed in epoxy-based adhesive agent e.g., NH-070A(T) manufactured by NIHON HANDA CO., Ltd. The conductive layer 136*a* may have a thickness of approximately 8 μm. The conductive layer 136*a* may have a circular shape, which has approximately 160 μm in diameter, in plan view.

The conductive layer 136*a* may have a hardness that is less than a hardness of the individual electrodes 105. In addition, the conductively layer 136*a* may have a hardness that is less than a hardness of the individual bump 136*b*. For example, as a result of hardness test on the basis of JIS K7215 Type D, the conductive layer 136*a* may have a hardness of 73, and the individual bump 136*b* may have a hardness of 85 in the same hardness test. Since the surface electrode 145 and the individual electrode 135 are formed of the same material, they may have substantially the same hardness. In other words, the conductive layer 136*a* may be subject to greater plastic deformation than the individual electrode 135 and the surface electrode 145.

Figure 6:
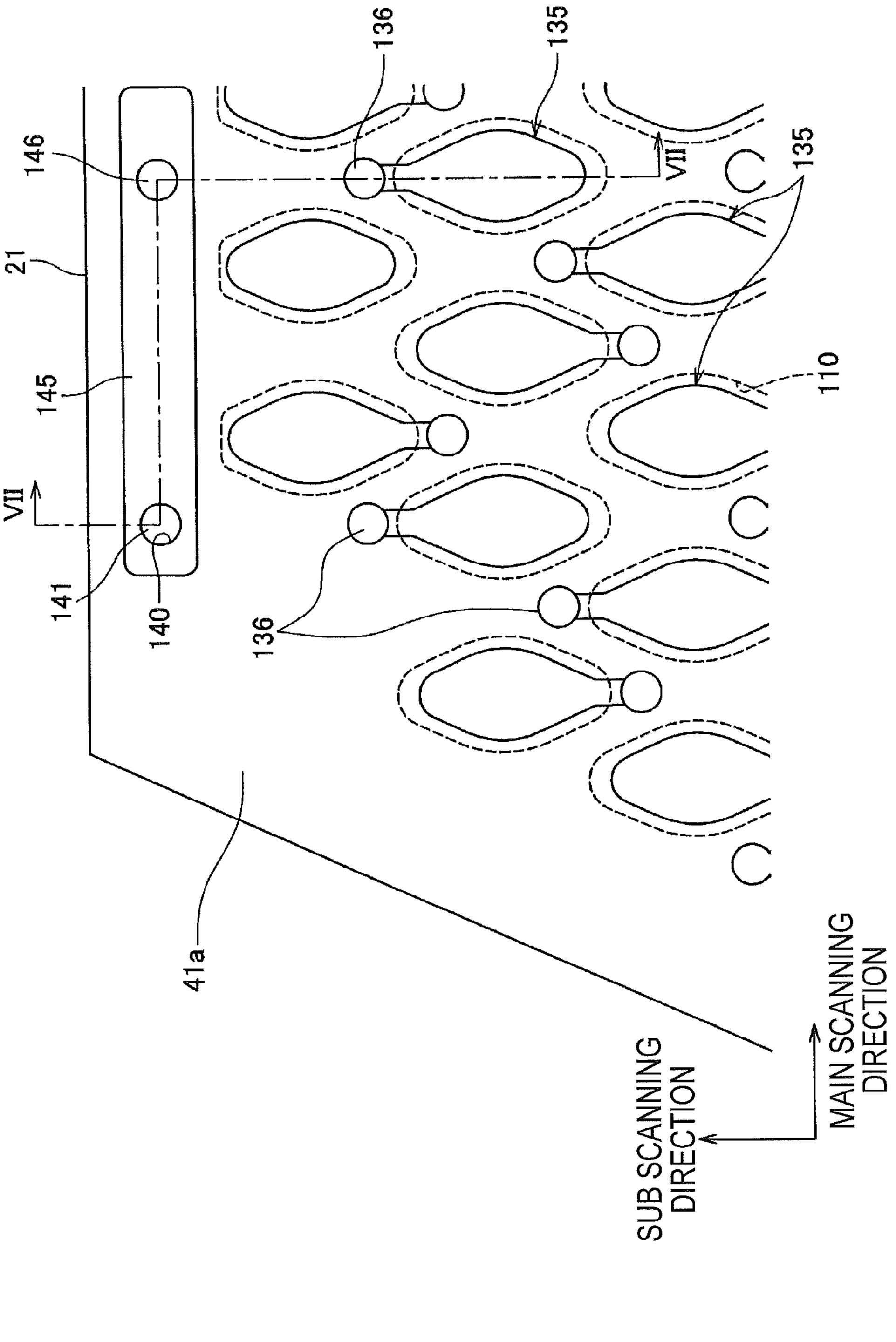
FIG. 6 is a plan view of an actuator unit in an area VI surrounded by a long and short dash line shown in FIG. 3.

Referring to FIG. 6 and FIG. 7, the actuator unit 21 may include the elongated surface electrode 145 positioned on the upper surface 41*a* of the piezoelectric ceramic layer 41, and the common bump 146 positioned on the surface electrode 145. The surface electrode 145 may extend near four corners of the upper surface 41*a* along the main scanning direction, and the common bump 146 may be disposed on a portion in the vicinity of one end of the each surface electrode 145, e.g., in the vicinity of the right end of FIG. 6. A portion in the vicinity of the other end of the surface electrode 145 may oppose a through hole 140 penetrating through the piezoelectric ceramic layer 41, and may be electrically connected to the common electrode 134 via a conductive member 141 provided in the through hole 140.

The individual electrode 135, the common electrode 134, and the surface electrode 145 may be configured of, for example, Ag—Pd based metal material. The individual electrode 135 may have a thickness of approximately 1 μm, and the surface electrode 145 may have a thickness of approximately 9 μm. The surface electrode 145 may be thicker than the individual electrode 135. The common electrode 134 may have a thickness of approximately 2 μm. The common bump 146 may be configured of the same material as the individual bump 136*b*. The common bump 146 may have the same size in plan view and the same thickness as the individual bump 136*b*. In this embodiment, the thickness of the respective bumps 136*b* and 146 may be set to 25 μm.

Referring to FIG. 7, a thickness, i.e., height H1, which is the sum of the thicknesses of the common bump 146 and the surface electrode 145, may be the same as a thickness, i.e., height H2, which is the sum of the thicknesses of the individual bump 136*b*, the conductive layer 136*a*, and the individual electrode 135. The conductive layer 136*a* may be plastically deformed by the application of the pressure at the time of manufacturing the ink-jet head, such that the height H1 becomes the same as the height H2, for example, 34 μm.

The actuator unit 21 may be a piezoelectric displacement element of a unimorph type including the piezoelectric ceramic layer 41 as an active layer, which is displaced by the application of an electric field. In the event of driving the actuator units 21, the individual electrodes 135 may be brought to have different potentials from that of the common electrode 134 in advance, and the individual electrodes 135 may be brought to the same potential as that of the common electrode 134 once upon a discharge request. Then, the individual electrodes 135 may be brought back to have the different potentials from that of the common electrode 134 again at a predetermined timing.

In this case, in the initial state, the areas opposing the individual electrodes 135 of the piezoelectric ceramic layers 41 to 43 are deformed into a convex shape toward the pressure chambers 110. Then, in the event of the discharge request, the piezoelectric ceramic layers 41 to 43 assume a flat shape at a timing when the individual electrodes 135 are brought to have the same potential as that of the common electrode 134, such that the ink is sucked from the manifold flow channel 105 into the pressure chambers 110. Then, areas opposing the individual electrodes 135 of the piezoelectric ceramic layers 41 to 43 may be deformed into a convex shape toward the pressure chambers 110 at the timing when the individual electrodes 135 are brought into the different potentials from that of the common electrode 134 again, and the pressure applied to the ink may be increased due to the reduction of the capacities of the pressure chambers 110, whereby the ink may be discharged.

Figure 8:
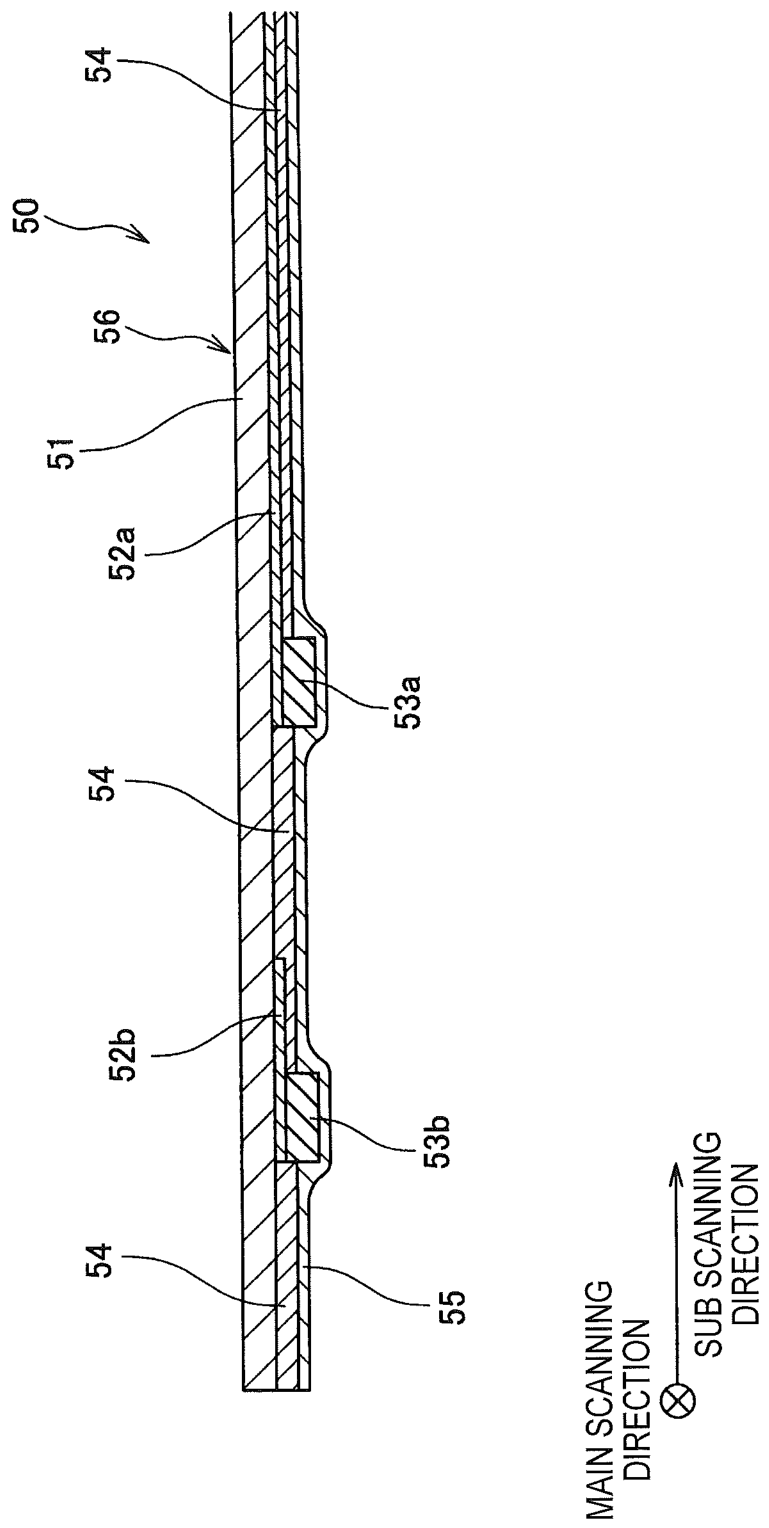
FIG. 8 is a partial cross-sectional view of a COF before being joined to the actuator unit according to an embodiment of the invention.

Referring to FIG. 8, the COF 50 may be a sheet-shaped laminated member including a flexible substrate 56 on which the driver IC 57 is mounted, and a joint layer 55 extended over the entire lower surface of the flexible substrate 56. The flexible substrate 56 may include a base material 51, the plurality of hard wires 52*a* and 52*b* positioned on a lower surface of the base material 51, the plurality of terminals 53*a* and 53*b* positioned at distal ends of the hard wires 52*a* and 52*b*, and a covered layer 54 for covering the hard wires 52*a* and 52*b*.

The base material 51 may be a sheet-shaped member having both insulation characteristics and flexibility. The base material 51 may be formed of, for example, synthetic resin such as polyimide. The plurality of hard wires 52*a* and 52*b* may be configured of, for example, copper foil. The plurality of hard wires 52*a* independently may connect the terminals 53*a* and 53*b* with the driver IC 57. The plurality of terminals 53*a* may be positioned corresponding to the individual lands 136, and the terminal 53*b* may be disposed corresponding to the common bump 146.

The covered layer 54 may be configured of resin material having insulation characteristics. The covered layer 54 may be extended over the entire area on the lower surface of the base material 51 except for the plurality of terminals 53*a* and 53*b*. In other words, the plurality of terminals 53*a* and 53*b* may project respectively from the covered layer 54. The covered layer 54 electrically may insulate the plurality of hard wires 52*a* and 52*b* from the periphery and may function to protect the same from disconnection due to an external force. The covered layer 54 may be configured of heat cured resin such as epoxy resin, urethane resin, or polyimide-based resin, for example.

The joint layer 55 may cover the terminals 53*a* and 53*b* before joining the COF 50 to the actuator units 21. However, referring to FIG. 7, when the COF 50 is joined to the actuator unit 21, the joint layer 55 may physically join the flexible substrate 56 and the actuator units 21 in a state in which the terminals 53*a* and 53*b* are brought into contact with, i.e., electrically connected to, the individual land 136 and the common bump 146 while covering a contact portion therebetween.

The joint layer 55 may be configured of resin material which exhibits resiliency when the shearing stress acting in the interior thereof is small, and exhibits a flowing property by expressing plastic flow when the shearing stress of an extent greater than a certain level acts thereon. As resin material having such characteristics, for example, resin obtained by adding organic particles, e.g., organic particles of 25 to 90 parts by weight, to epoxy resin based adhesive agent may be used. The epoxy resin may be of any suitable type, e.g., bisphenol A type, bisphenol F type, phenolic novolac type, cresol novolac type, or aliphatic epoxy resin, and the like.

The organic particles to be added here may be particles of, e.g., acrylic-based resin, styrene-butadiene based resin, styrene-butadiene-acrylic-based resin, melamine resin, melamine-isocyanurate additives, polyimide, silicone resin, polyetherimide, polyethersulfone, polyester, polycarbonate, polyether ether ketone, polybenzimidazole, polyarylate, liquid crystal polymer, olefin-based resin, ethylene-acryl copolymer, and the like. The size of the particles may be not larger than 10 μm, and in an embodiment of the invention, the size of the particles may not larger than 5 μm. Also, functional reactive group may be mixed in order to enhance mutual solubility between the epoxy resin and the organic particles.

Figure 9:
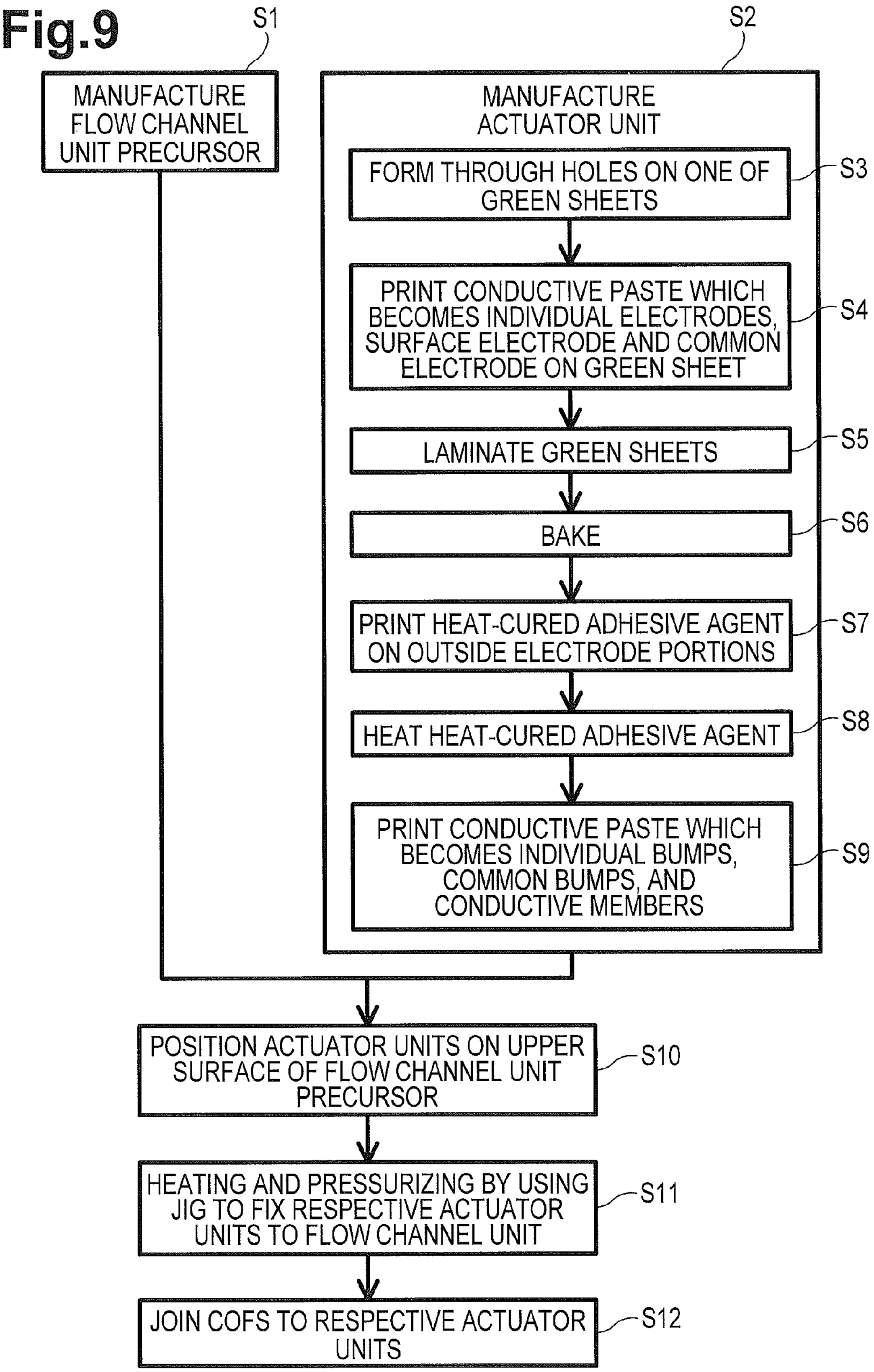
FIG. 9 is a flowchart showing a method of manufacturing the ink-jet head according to an embodiment.

FIGS. 9 and 10 describe a method of manufacturing the ink-jet head 1 according to an embodiment of the invention. Referring to FIG. 9, in Step S1, e.g., a flow-channel unit precursor manufacturing step, at first, a plurality of, e.g., nine, metal plates configured of stainless steel or the like may be applied with an etching process to form holes, whereby the plates 122 to 130 may be manufactured. Then, the plates 122 to 130 may be positioned adjacent to each other to define the individual ink flow channels 132 with the holes, and may be laminated via epoxy-based heat cured adhesive agent. Accordingly, the precursor of the flow channel unit 9 may be manufactured.

In Step S2, e.g., an actuator unit manufacturing step, a plurality of, e.g., three, green sheets, as materials of the trapezoidal piezoelectric ceramic layers 41 to 43, which are configured in advance in consideration of the amount of shrinkage caused by baking, may be prepared first. Then, at Step S3, the through holes 140 may be formed on the green sheet which becomes the piezoelectric ceramic layer 41. Subsequently, at Step S4, Ag—Pd-based conductive paste may be screen-printed in a pattern of the individual electrodes 135 and a pattern of the surface electrodes 145 on the green sheet which becomes the piezoelectric ceramic layer 41, and in a pattern of the common electrode 134 on the green sheet which becomes the piezoelectric ceramic layer 42, respectively. At this time, the conductive paste which becomes the surface electrode 145 may be formed with a hole which constitutes the part of the through hole 140.

At Step S5, the green sheet which becomes the piezoelectric ceramic layer 42 may be overlapped with the green sheet, which is not printed and becomes the piezoelectric ceramic layer 43, with the surface having the common electrode 134 printed thereon faced upward while positioning by the jig. The green sheet which becomes the piezoelectric ceramic layer 41 may be overlapped with the green sheet which becomes the piezoelectric ceramic layer 42, with the surface having the individual electrodes 135 and the surface electrodes 145 printed thereon faced upward while positioning by the jig. Subsequently, at Step S6, the laminated structure of the green sheets may be degreased, and may be baked at a predetermined temperature in the same manner as the known ceramic. Accordingly, the plurality of, e.g., three, green sheets may become the piezoelectric ceramic layers 41 to 43 and the conductive paste may become the individual electrodes 135, the surface electrodes 145, and the common electrode 134. The precursor of the actuator units 21 may be completed with the steps from Step S3 to Step S6.

At Step S7, conductive heat cured adhesive agents 190 may be printed on the outside electrode portions 135*c* of the respective individual electrodes 135 by using the patterned mask. At this time, referring to FIG. 10A, the heat cured adhesive agents 190 may be applied on the outside electrode portions 135*c* such that the thickness J2, which is the sum of the thicknesses of the heat cured adhesive agent 190 and the outside electrode portion 135*c* becomes larger than the thickness J1 of the surface electrodes 145. Here, the thickness of the heat cured adhesive agents 190 may be set to 25 μm.

The precursor of the actuator unit applied with the heat cured adhesive agents 190 may be heated for 30 minutes at a temperature of 120° C., for example. In this embodiment, at Step S8, the heat cured adhesive agents 190 may be in a state of not being completely cured, e.g., at a semi-curing step. The heat cured adhesive agents 190 may become the conductive layers 136*a*. The conductive layers 136*a* may have a hardness which subjects the conductive layers 136*a* to deformation by an external force, such that the deformation of conductive layers 136*a* may be more than that of the individual electrodes 135 and the surface electrode 145. In an embodiment of the invention, the hardness of the conductive layer 136*a* in this state may be 60 as a result of the hardness test on the basis of JIS K7215 Type D.

Figure 10A:
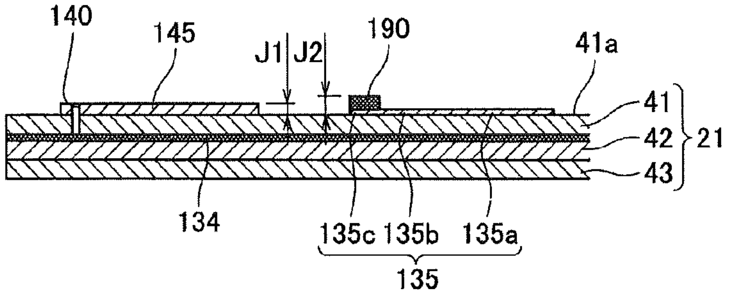
FIG. 10 is a drawing showing a manufacturing process of the ink-jet head according to an embodiment.
Figure 10B:
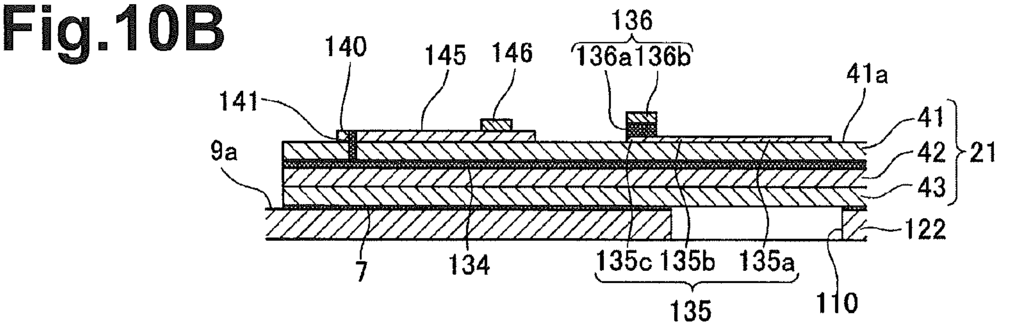

Referring to FIG. 10B, at Step S9, e.g., a conductive paste forming step, acrylic-based conductive paste containing Ag as filler material, which becomes the individual bumps 136*b*, the common bumps 146, and the conductive members 141, may be printed and formed at predetermined positions on the conductive layers 136*a*, on the surface electrodes 145, and in the through holes 140 respectively by using the patterned mask. At this time, the conductive pastes which become the individual bumps 136*b* and the common bumps 146 may be formed to have the same thickness. As the conductive paste, natural seasoning type acrylic-based adhesive agent, e.g., DOTITE D-362, manufactured by FUJIKURAKASEI Co., LTD. may be used, and may be formed into a thickness of approximately 25 μm.

Then, in an embodiment of the invention, the conductive paste may have a hardness of approximately 65, which is harder than the conductive layers 136*a*, which may have a hardness approximately 60 in the semi-cured state by drying for three hours at a temperature of 25° C. In this manner, the individual lands 136, the common bumps 146, and the conductive members 141 may be positioned, whereby the actuator unit 21 may be completed.

If the heat cured adhesive agent 190 is softer than the conductive paste which becomes the individual electrodes 135, thus allowing the heat cured adhesive agent 190 to be formed on the conductive paste, then the procedures of Step S7 and Step S8 may be performed in sequence after Step S5 (S5). In this case, the Step S6 may be included in Step S8. Accordingly, in an embodiment of the invention, the heating step in Step S6 to be performed between Step S5 and Step S7 may be omitted, and the method may be shortened.

At Step S10, e.g., the positioning step, the plurality of, e.g., four, actuator units 21 manufactured in the above-described manner may be positioned on the upper surface of the precursor of the flow channel unit 9, i.e., the upper surface 9*a* of the cavity plate 122, as shown in FIG. 10B (S10: positioning step). In this case, an epoxy-based heat cured adhesive agent 7 e.g., DODENT NH-070(A) manufactured by NIHON HANDA CO., Ltd, may be applied on the upper surface 9*a* of the precursor of the flow channel unit 9. The plurality of, e.g., four actuator units 21 may be registered and arranged in a zigzag pattern, as shown in FIG. 2. At this time, the main electrodes 135*a* of the individual electrodes 135 may oppose the pressure chambers 110.

Figure 10C:
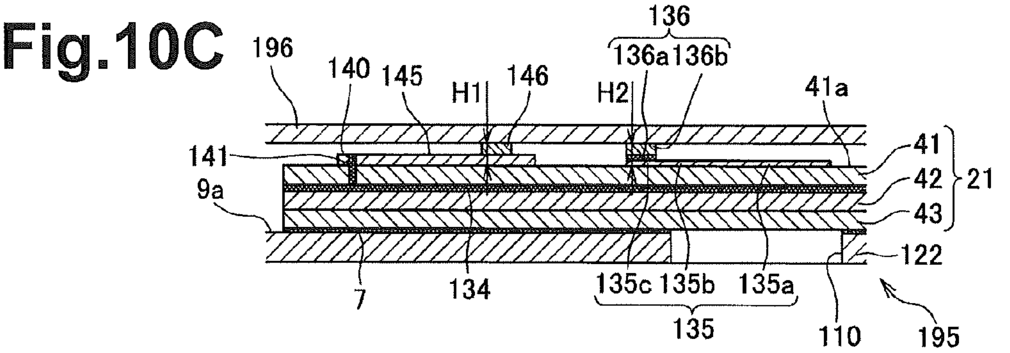

A laminated member 195 including the precursor of the flow channel unit 9 and the plurality of, e.g., four, actuator units 21 may be placed on a flat table of the heating and pressurizing device. Referring to FIG. 10C, the actuator unit 21 may be heated while being pressurized against the precursor of the flow channel unit 9 by a flat-panel-shaped jig 196. At Step S11, e.g., the fixing step, for example, the respective actuator units 21 may be fixed to the upper surface 9*a* by heating for ten minutes at a temperature of 120° C. At this time, the conductive layer 136*a* in the semi-cured state may be cured to a predetermined hardness, e.g., approximately 73, although being plastically deformed while conductive layer 136*a* is curing to the predetermined hardness.

In this step, the jig 196 may come into contact with the individual bumps 136*b* first. Then, the conductive layers 136*a* having a hardness of approximately 60 may be plastically deformed to reduce the thickness as the jig 196 approaches the actuator units 21. When the total thickness H1 (i.e., the sum of the thicknesses of the surface electrode 145 and the common bump 146) becomes the same as the total thickness H2 (i.e., the sum of the thicknesses of the individual electrode 135, the conductive layer 136*a*, and the individual bump 136*b*), the jig 196 may come into contact with the common bump 146, and the pressurizing force from the jig 196 may be supported by the both bumps 136*b* and 146. In the latter half of the fixing step, the conductive layers 136*a* may be completely cured, and a unit pressure transmitted to the individual bump 136*b* may be substantially the same as a unit pressure transmitted to the common bump 146. Accordingly, the thickness of the layer of the heat cured adhesive agent 7 after having cured may become uniform.

At this time, in the conductive paste forming step, even when the thicknesses are varied among the individual bumps 136*b*, or between the individual bumps 136*b* and the common bump 146, the conductive layers 136*a* may be plastically deformed to absorb all the variations in thickness therebetween as described above. Therefore, upper surfaces of the common bump 146 and the plurality of individual bumps 136*b* may be aligned at the same level with respect to the upper surface 41*a* of the piezoelectric ceramic layer 41.

In this manner, the precursor of the flow channel unit 9 and the actuator unit 21 may be fixed via the layer of the heat cured adhesive agent 7 having the uniform thickness. Since the uniform pressure is applied also to the heat cured adhesive agents between the respective plates of the flow channel unit 9, these heat cured adhesive agents may be also cured in a state of being restrained from varying in thickness, thereby the flow channel unit 9 may be manufactured. In this manner, the head body 2 may be completed, and may have little dimensional error about the direction of lamination.

In this embodiment, the precursor of the flow channel unit 9 may be not heated in Step S1 and the precursor may be heated together when manufacturing the head body 2 in Step S11, thereby the flow channel unit 9 may be manufactured. Therefore, in an embodiment of the invention, the heating step for fabricating the flow channel unit 9 may be omitted in Step S1, such that the manufacturing process is shortened.

The flow channel unit 9 may also be manufactured by pressurizing and heating the precursor of the flow channel unit 9 in Step S1. Then, the actuator units 21 may be fixed on the upper surface 9*a* of the fabricated flow channel unit 9 in Step S11.

Figure 10D:
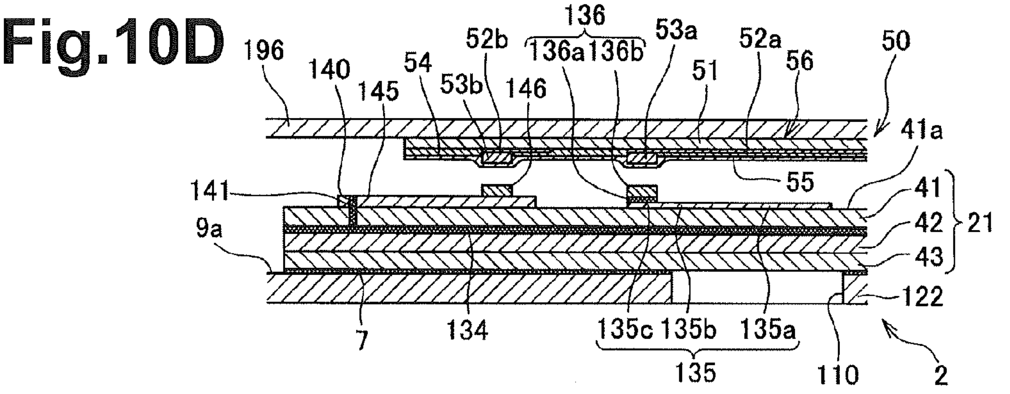

Referring to FIG. 10D, at Step S12, e.g., the joining step, the COFs 50 may be joined to the respective actuator units 21 by heating and pressurizing by the jig 196 in a state of being positioned such that the terminals 53*a* and 53*b* of the COFs 50 oppose the corresponding individual bumps 136*b* and the common bumps 146.

At this time, the portions of the joint layers 55 which cover the terminals 53*a* and 53*b* may be pressurized between the terminals 53*a* and 53*b*, and the individual bumps 136*b* and the common bumps 146, thereby plastic flow may express. Accordingly, referring back to FIG. 7, the portions covering the terminals 53*a* of the joint layers 55 may spread and cover the portions where the terminals 53*a* and the individual lands 136 are in contact with each other, and may reach the portion in the vicinity of the peripheries of the outside electrode portions 135*c*. In contrast, the portions of the joint layers 55 covering the terminals 53*b* may cover the portions where the terminals 53*b* and the common bumps 146 are in contact with each other, and may reach the surface electrodes 145. In this manner, the surfaces of the piezoelectric ceramic layers 41 and the surfaces of the flexible substrate 56 may be directly joined by the joint layers 55.

Furthermore, the portions of the joint layers 55 covering the terminals 53*a* and 53*b* may flow outward totally from between the terminals 53*a* and 53*b*, and the individual bumps 136*b* and the common bumps 146, such that the COFs 50 and the actuator units 21 are joined together in a state of being electrically connected, respectively.

Subsequently, the reservoir unit 71, the control substrate 64, the side cover 63, and the head cover 65 may be attached to the head body 2 in which the COFs 50 are joined to the respective actuator units 21, such that the manufacture of the ink-jet head 1 is completed.

As described above, according to the above-described embodiment, since the conductive layers 136*a* are positioned between the individual electrodes 135 and the individual bumps 136*b*, respectively, when some external force is applied to the individual lands 136, an impact applied to the piezoelectric ceramic layers 41 to 43 may be alleviated by the deformation of the conductive layers 136*a*. Also, at the time of manufacturing, the variations in height of the individual bumps 136*b* and the common bumps 146, which are caused by variations in thickness of the individual electrodes 135 and the surface electrodes 145, may be absorbed by the conductive layers 136*a*, and the variations of the pressurizing force to the heat cured adhesive agents 7 between the actuator units 21 and the flow-channel unit 9 may be restrained. Therefore, the distance between the lower surfaces of the actuator units 21 and the upper surface 9*a* of the flow channel unit 9 may be constant as a whole, such that the variations in capacity of the plurality of pressure chambers 110 are almost eliminated. Consequently, variations in pressure applied to the ink in the pressure chambers 110 may be reduced, such that the ink discharging characteristics from the nozzles 108 are uniformized.

Because of the intermediary of the conductive layers 136*a* between the COFs 50 and the actuator units 21, even when an external force is applied to the COFs 50 when handling the ink-jet head 1 in which the COFs 50 are joined, the impact applied to the piezoelectric ceramic layers 41 to 43 may be alleviated by the deformation of the conductive layers 136*a*.

In the above-described embodiment, the piezoelectric ceramic layers 41 to 43 of the actuator units 21 have the size which extends across the plurality of pressure chambers 110. However, in another embodiment of the invention, the piezoelectric ceramic layer 41 including active portions may be configured of a plurality of divided piezoelectric ceramic layers which cover the pressure chambers 110 individually. In this case, the green sheet which becomes the uppermost piezoelectric ceramic layer 41, including the active portions, may be cut into the divided piezoelectric ceramic layers which cover the pressure chambers 110 individually after Step S5 and before Step S6. In this embodiment, the piezoelectric ceramic layers 42 and 43 and the common electrode 134 may function as a single diaphragm. The diaphragm having the conductivity may be adhered to the upper surface 9*a* of the flow channel unit 9 via the heat cured adhesive agent 7 instead of the piezoelectric ceramic layers 42 and 43 and the common electrode 134.

In the above-described embodiment, the conductive layers 136*a* are plastically deformed by the pressurizing force in the fixing step. However, in another embodiment, the conductive layers 136*a* may be elastically deformed. In other words, the conductive layers 136*a* may simply be deformable by the pressurizing force more easily than the individual electrodes 135 and the surface electrodes 145.

In the above-described embodiment, the conductive layers 136*a* are cured to a hardness of approximately 60 in the semi-curing step in Step S8, provided that the paste of the natural seasoning type is used in the conductive paste forming step in Step S9. However, in another embodiment of the invention, if both the bumps 136*b* and 146 are harder than the conductive layer at a time point when both the bumps 136*b* and 146 are completed, an adhesive agent of a lower temperature heating type, which requires a thermal processing at a temperature on the order of 60° C., may be used instead of the conductive adhesive agent of the natural seasoning type. In yet another embodiment, the conductive adhesive agent requiring a predetermined thermal processing may also be used. For example, when DOTITE XA-5617, manufactured by FUJIKURAKASEI Co., LTD. is used, the thermal processing for about 35 minutes at a temperature of 120° C. is required in the conductive paste forming step, and a bump on the order of 85 is obtained by the hardness test on the basis of JIS K7215 Type D. Although the curing of the conductive layers 136*a* is completed during this step, the obtained hardness is on the order of 73, and the conductive layers 136*a* may effectively function as height adjusting layers in the fixing step.

In the above-described embodiment, although the individual bumps 136*b* and the common bumps 146 are positioned, both of these bumps 136*b* and 146 do not have to be positioned. In this embodiment, Step S9 may be omitted. In the fixing step, the jig 196 and the conductive layers 136*a* may come into contact with each other first, and then the thicknesses of the conductive layers 136*a* may be reduced by the plastic deformation as the jig 196 gradually approaches the actuator units 21. When the thickness of the surface electrodes 145 becomes the same as the sum of the thicknesses of the individual electrode 135 and the conductive layer 136*a*, the surface electrodes 145 and the jig 196 may come into contact with each other. In this embodiment, since the pressurizing force of the jig 196 is applied uniformly on the surface electrodes 145 and the individual electrodes 135 as in the above-described case, variations in thickness of the heat cured adhesive agents 7 between the flow channel unit 9 and the actuator units 21 may be restrained.

In the above-described embodiment, the thickness of the surface electrode 145 is set to be larger than that of the individual electrode 135. However, in another embodiment, the thickness of the individual electrode may be larger than that of the surface electrode. In this case, the conductive layer may be positioned on the surface electrodes as the first electrodes, while the conductive layer may be not positioned on the individual electrodes as the second electrodes. The joint layer 55 of the COF 50 may be not formed entirely on the lower surface of the flexible substrate 56, as long as the respective terminals 53*a* and 53*b* and the areas in the peripheries thereof are covered before being joined to the actuator unit 21. Also, the wiring members other than the COFs 50 may be electrically connected with the surface electrodes 145 and the individual electrodes 135. Furthermore, in yet another embodiment of the invention, the COF 50 may be omitted from the ink-jet head 1.

Although the above-described embodiment is an example of the ink-jet head which ejects the ink from the nozzles, this invention is not limited to the ink-jet head. For example, in other embodiments of the invention, the invention may be applied to a liquid discharge head for configuring minute wiring pattern on a substrate by discharging conductive paste, configuring a high-definition display by discharging organic light-emitting material on the substrate, or configuring a minute electronic device such as a light guide by discharging optical resin on the substrate.

While the invention has been described in connection with various exemplary structures and illustrative embodiments, it will be understood by those skilled in the art that other variations and modifications of the structures and embodiments described above may be made without departing from the scope of the invention. Other Structures and embodiments will be apparent to those skilled in the art from a consideration of the specification or practice of the invention disclosed herein. It is intended that the specification and the described examples are illustrative with the true scope of the invention being defined by the following claims.

What is claimed is:

1. A method of manufacturing a liquid discharge head comprising a flow channel unit comprising a plurality of pressure chambers which are opened on one surface thereof, the method comprising the steps of:

manufacturing an actuator unit comprising a piezoelectric layer which covers the pressure chambers, and is adhered to the one surface of the flow channel unit such that the piezoelectric layer provides a pressure to liquid in the pressure chambers, comprising the steps of:

forming a first electrode and a second electrode on the actuator unit to be positioned on a surface of the piezoelectric layer, wherein the second electrode is thicker than the first electrode; and forming a conductive layer which is laminated on the first electrode, wherein the conductive layer comprises a material subject to deformation by a pressurizing force, such that the sum of the thicknesses of the conductive layer and the first electrode is larger than the thickness of the second electrode prior to the fixing step;

positioning the actuator unit on a cavity plate comprising the one surface of the flow channel unit via a heat cured adhesive agent; and fixing the actuator unit to the cavity plate, wherein the fixing step comprises heating and pressurizing by a jig, and wherein the conductive layer is deformed by the pressurizing force more than the first and the second electrode is each deformed, wherein the conductive layer is plastically deformed such that the thickness of the second electrode and the sum of the thicknesses of the conductive layer and the first electrode become the same after the pressurizing force is applied in the fixing step.

2. The method of manufacturing a liquid discharge head according to claim 1, wherein the first and the second electrode are not deformed by the fixing step.

3. The method of manufacturing a liquid discharge head according to claim 1, wherein the fixing step comprises the substeps of:

applying the pressurizing force from the jig to the first and second electrodes; and pressurizing the actuator unit against the cavity plate by the jig, such that the thickness of the conductive layer is reduced by deformation.

4. The method of manufacturing a liquid discharge head according to claim 3, wherein the conductive layer is plastically deformed such that the thickness of the second electrode and the sum of the thicknesses of the conductive layer and the first electrode become the same after being pressurized by the jig in the fixing step.

5. The method of manufacturing a liquid discharge head according to claim 1, further comprising a step of laminating a plurality of plates comprising the cavity plate via the heat cured adhesive agent to form a precursor of the flow channel unit before the positioning step, wherein the fixing step comprises the substep of curing the heat cured adhesive agent.

6. The method of manufacturing a liquid discharge head according to claim 1, wherein the piezoelectric layer is arranged so as to extend across the plurality of pressure chambers, and the actuator unit further comprises a common electrode, wherein the step of forming the first electrode and the second electrode comprises the substeps of:

positioning the first electrode individually on the surface of the piezoelectric layer, such that the first electrode comprises a main electrode portion opposing the pressure chamber and an outside electrode portion opposing the outside area of the pressure chamber in plan view; and positioning the second electrode on the surface of the piezoelectric layer, and electrically connecting the second electrode to the common electrode, and wherein the step of positioning the actuator unit comprises the substep of:

positioning the actuator unit with respect to the cavity plate such that the main electrode portion and the pressure chamber oppose to each other, and such that the common electrode interposes the piezoelectric layer in cooperation with the first and second electrodes therebetween.

7. The method of manufacturing a liquid discharge head according to claim 4, wherein the step of manufacturing the actuator unit comprises the substep of positioning the conductive layer on the outside electrode portion.

8. The method of manufacturing a liquid discharge head according to claim 7, wherein the step of manufacturing the actuator unit comprises the substeps of:

positioning the conductive layer, which comprises conductive heat cured adhesive agent, on the outside electrode portion; and semi-curing the conductive layer, by heating the conductive layer until a semi-cured state in which curing is not completed is achieved.

9. The method of manufacturing a liquid discharge head according to claim 1, wherein the step of manufacturing the actuator unit comprises the substeps of:

forming a conductive paste on the conductive layer and the second electrode; and curing the conductive paste in association with heating in the fixing step to form a first bump and a second bump from the conductive paste which are harder than the conductive layer.

10. The method of manufacturing a liquid discharge head according to claim 9, further comprising the steps of:

forming a wiring member which is electrically connected to the first and second bumps and that comprises a base material, a plurality of hard wires positioned on at least one of the surfaces of the base material, a plurality of terminals, and a joint layer, wherein the step of forming the wiring member comprises:

forming the plurality of terminals in a projecting shape corresponding to the first and second bumps and electrically connected to the plurality of hard wires; and pressurizing and heating the joint layer, which comprises a resin material, such that the joint member expresses plastic flow, wherein the plastic flow of the joint layer causes the joint layer to cover the plurality of terminals and the areas in the peripheries thereof.

11. The method of manufacturing a liquid discharge head according to claim 10, further comprising a step of joining, the step of joining comprising the substeps of:

causing the joint layer to express plastic flow in a state in which the plurality of terminals are opposed to the first and second bumps;

bringing the first and second bumps are into direct contact with the plurality of terminals such that a contact portion between the first and second bumps and the terminals are covered by the joint layer;

joining the wiring member with the actuator unit after the fixing step.

* * * * *